(12) United States Patent
Mercier et al.

(10) Patent No.: US 11,288,259 B2
(45) Date of Patent: Mar. 29, 2022

(54) VALIDATION AND RECOMMENDATION ENGINE

(71) Applicant: AUTODESK, INC., San Rafael, CA (US)

(72) Inventors: Daniel Mercier, Toronto (CA); Anthony Ruto, London (GB)

(73) Assignee: AUTODESK, INC., San Rafael, CA (US)

( * ) Notice: Subject to any disclaimer, the term of this patent is extended or adjusted under 35 U.S.C. 154(b) by 190 days.

(21) Appl. No.: 16/694,910

(22) Filed: Nov. 25, 2019

(65) Prior Publication Data

US 2021/0034603 A1     Feb. 4, 2021

Related U.S. Application Data

(60) Provisional application No. 62/880,358, filed on Jul. 30, 2019.

(51) Int. Cl.
    *G06F 7/00*     (2006.01)
    *G06F 16/23*    (2019.01)
    *G06N 5/04*     (2006.01)

(52) U.S. Cl.
    CPC ........... *G06F 16/2365* (2019.01); *G06N 5/04* (2013.01)

(58) Field of Classification Search
    CPC .............................. G06F 16/2365; G06N 5/04
    USPC .................................................. 707/600–899
    See application file for complete search history.

(56) References Cited

U.S. PATENT DOCUMENTS

| | | |
|---|---|---|
| 6,654,932 B1 | 11/2003 | Bahrs et al. |
| 2013/0111310 A1 | 5/2013 | De Oliveira et al. |
| 2020/0110755 A1* | 4/2020 | Waldman ............. G06F 9/451 |

OTHER PUBLICATIONS

International Search Report for application No. PCT/US2020/044257 dated Nov. 2, 2020.
Aljawarneh et al., "A Semantic Data Validation Service for Web Applications", Journal of Theoretical and Applied Electronic Commerce Research, DOI: 10.4067/S0718-18762010000100005, ISSN 0718-1876, vol. 5, No. 1, Apr. 2010, pp. 39-55.
Baset et al., "Object-Oriented Modeling with Ontologies Around:A Survey of Existing Approaches", International Journal of Software Engineering and Knowledge Engineering, DOI: 10.1142/S0218194018400284, vol. 28, No. 11&12, 2018, pp. 1775-1794.
Da Cruz et al., "Automatic Generation of Interactive Prototypes for Domain Model Validation", In Third International Conference on Software and Data Technologies, INSTICC, SciTePress, vol. 2, 2008, pp. 206-213.
ESS Handbook, "Methodology for data validation", Technical Report 2.0, European Statistical System, 2018, 85 pages.

(Continued)

*Primary Examiner* — Isaac M Woo
(74) *Attorney, Agent, or Firm* — Artegis Law Group, LLP

(57) ABSTRACT

One embodiment of the present invention sets forth a technique for validating a set of input data used by a software application, the method comprising: determining a first validation class for a first portion of the set of input data; determining a first validation operation to be performed on the first portion of the set of input data based on the first validation class; causing the first validation operation to be performed on the first portion of the set of input data; determining that the first validation operation is unsuccessful; and generating a validation report indicating that the set of input data includes an error.

25 Claims, 7 Drawing Sheets

(56) References Cited

OTHER PUBLICATIONS

Zalila et al., "A Model-Driven Tool Chain for OCCI", In 35th International Conference on Cooperative Information Systems, 2017, pp. 7-26.
Fielding, Roy Thomas, "Architectural Styles and the Design of Network-based Software Architectures", PhD thesis, Information and Computer Science, 2000, pp. 1-162.
Herrmann et al., "Domain-Independent Data Validation and Content Assistance as a Service", In 19th International Conference on Web Services, IEEE, DOI 10.1109/ICWS.2012.65, 2012, pp. 407-414.
Gil et al., "Explicit Representations of Problem-Solving Strategies to Support Knowledge Acquisition", In 13th National Conference on Artificial Intelligence, Aug. 4-8, 1996, pp. 1-18.
Hohpe et al., "Enterprise Integration Patterns: Designing, Building, and Deploying Messaging Solutions", The Addison-Wesley Signature Series, 2003, 98 pages.
Kezadri et al., "First Steps Toward a Verification and Validation Ontology", In International Conference on Knowledge Engineering and Ontology Development, INSTICC, SciTePress, DOI: 10.5220/0003102904400444, vol. 1, 2010, pp. 440-444.
Khouri et al., "Combining Artificial Intelligence, Ontology, and Frequency-Based Approaches to Recommend Activities in Scientific Workflows", http://dx.doi.org/10.22456/2175-2745.75048, vol. 25, No. 1, 2018, pp. 39-47.
Kim, Chang Hwan Peter, "On the Relationship between Feature Models and Ontologies", Master's thesis, University of Waterloo, 2006, pp. 1-80.
Kim et al., "Principles for interactive acquisition and validation of workflows", Journal of Experimental & Theoretical Artificial Intelligence, DOI: 10.1080/09528130902823698, vol. 22, No. 2, Jun. 2010, pp. 103-134.
Lamy, Jean-Baptiste, "Ontology-Oriented Programming for Biomedical Informatics", Studies in health technology and informatics, DOI 10.3233/978-1-61499-633-0-64, vol. 221, 2016, pp. 64-68.
Motik et al., "Hypertableau Reasoning for Description Logics", Journal of Artificial Intelligence Research, vol. 36, No. 1, 2009, pp. 165-228.
Musen, Mark A., "Ontology-Oriented Design and Programming", In Knowledge Engineering and Agent Technology, IOS Press, 2004, 16 pages.
Quinton et al., "Towards Multi-Cloud Configurations Using Feature Models and Ontologies", In 2013 International workshop on Multi-cloud applications and federated clouds, Apr. 22, 2013, pp. 21-26.
Quinton et al., "Automated Selection and Configuration of Cloud Environments Using Software Product Lines Principles", In 2014 IEEE 7th International Conference on Cloud Computing, DOI 10.1109/CLOUD.2014.29, 2014, pp. 144-151.
Shanks et al., "Using Ontology to Validate Conceptual Models", Communications of the ACM, vol. 46, No. 10, Oct. 2003, pp. 85-89.
Strmecki et al., "An Overview on the use of Ontologies in Software Engineering", Journal of Computer Science, DOI: 10.3844/jcssp.2016.597.610, vol. 12, No. 12, 2016, pp. 597-610.
Tanida et al., "CLIENT-TIERVALIDATIONOFDYNAMICWEBAPPLICATIONS", In 6th International Conference on Software and Database Technologies, DOI: 10.5220/0003510500860095, INSTICC, SciTePress, vol. 2, 2011, pp. 86-95.
Tu et al., "Ontology-based configuration of problem-solving methods and generation of knowledge-acquisition tools: application of PROTEGE-II to protocol-based decision support", Artificial Intelligence in Medicine, vol. 7, 1995, pp. 257-289.
W3C "OWL Web Ontology Language", www.w3.org /TR/owl-features/, retreived on Apr. 20, 2019, 2004, 12 pages.
Wang et al., "Verifying feature models using OWL", Journal of Web Semantics, doi:10.1016/j.websem.2006.11.006, vol. 5, No. 2, 2007, pp. 117-129.
Zdun et al., "Model-Driven and Pattern-Based Integration of Process-Driven SOA Models", International Journal of Business Process Integration and Management, vol. 2, 2006, pp. 109-119.

* cited by examiner

VALIDATION AND RECOMMENDATION ENGINE

CROSS-REFERENCE TO RELATED APPLICATION

This application claims the benefit of U.S. Provisional Applications titled, "VALIDATION AND RECOMMENDATION ENGINE FROM SERVICE ARCHITECTURE AND ONTOLOGY," filed on Jul. 30, 2019 and having Ser. No. 62/880,358. The subject matter of this related application is hereby incorporated herein by reference.

BACKGROUND OF THE INVENTION

Field of the Invention

Embodiments of the present invention relate generally to computer science and, more specifically, to a validation and recommendation engine.

Description of the Related Art

The transition from desktop software applications to cloud-based software applications has altered the design and architecture of many software applications. Historically, desktop-based software applications have been designed to contain all functional requirements, from display to data handling and processing, necessary for those software applications to operate properly and effectively on a single device. By contrast, cloud-based software applications are typically designed as assemblies of functions that are configured as services that can be easily deployed and implemented on a cloud-based or distributed computing platform. To operate effectively within distributed environments, cloud-based software applications are normally built using a service-oriented architecture (SOA) and rely on derivative services or agents to execute all non-core functions. In most implementations, a user accesses cloud-based software applications through a browser-based user-interface or a user-interface associated with a lightweight desktop interface software that connects to back-end machines within the distributed computing platform that provide nearly unlimited storage and computing power. Unlike a monolithic, desktop architecture, cloud-based implementations require reliable inter-process communications and data integration to function properly.

Data integration requires strong data consistency over multiple computing systems, and data validation is central to maintaining such consistency. For example, when a back-end machine within a cloud-based or distributed computing platform is tasked with executing a series of computationally intensive operations for a cloud-based software application, such as a series of complex simulation operations, ensuring that the input data for those operations is consistent and valid (i.e., useful and free of errors) is critical for proper execution of the simulation. If the input data is inconsistent or invalid in some way, then significant computational resources can be expended by the back-end machine to generate potentially meaningless results or even to a complete failure. For example, the boundary conditions for a structural problem may describe forces that are known to exceed the strengths of various materials being considered for a particular structural member. Without a robust way to validate the data related to those boundary conditions and the strengths of the various materials being considered, a structural problem solver cannot dependably generate a family of valid solutions, where the correct solution would have involved a material having the appropriate strength.

In many instances, the input data required for execution of more complex software applications can, itself, be complex. For example, input data for a fluid analysis software application include various data subsets, such as a complete geometrical definition of a three-dimensional mesh, initial fluid flow conditions, specific boundary conditions, analytical parameters, to name a few. Each data subset can include errors specific to that particular type of data or include errors specific to the interconnection between such data subsets, therefore requiring specialized validation procedures and rules. As a result, a suitable validation process for all of the different data subsets can be difficult to implement and can require significant computational resources as well. Further, because any invalid input data can be both complex in organization and extensive in volume, determining how to modify that data to correct any errors or inconsistencies can be quite difficult and entail protracted trial-and-error troubleshooting.

As the foregoing illustrates, what is needed in the art are more effective techniques for validating data used with cloud-based software applications.

SUMMARY

One embodiment of the present invention sets forth a technique for validating a set of input data used by a software application, the method comprising: determining a first validation class for a first portion of the set of input data; determining a first validation operation to be performed on the first portion of the set of input data based on the first validation class; causing the first validation operation to be performed on the first portion of the set of input data; determining that the first validation operation is unsuccessful; and generating a validation report indicating that the set of input data includes an error.

At least one technical advantage of the disclosed techniques is that a complex validation process can be performed on input data prior to the input data being used in large-scale simulation or other computationally intensive operations. As a result, computational resources are not expended to generate a solution based on invalid data. Another technical advantage of the disclosed techniques is that each data subset of input data for a computationally intensive operation, such as a data subset associated with a particular validation class, can undergo a separate validation process. Consequently, validation errors can be tracked and corrected more easily, i.e., by validation class. Further, each separate validation process can be executed, depending on complexity, either locally by the service or externally on cloud-based computing assets. In this way, the expansive storage and computing power of distributed computing platforms is leveraged. By facilitating validation of input data, even when the input data is associated with various validation domains, the disclosed techniques improve the functioning or operation of a computing device. Thus, the advantages provide at least one technological improvement over prior art techniques, which frequently result in the expenditure of computational resources to process invalid data and generate difficult-to-troubleshoot validation errors.

BRIEF DESCRIPTIONS OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

Figure 4:
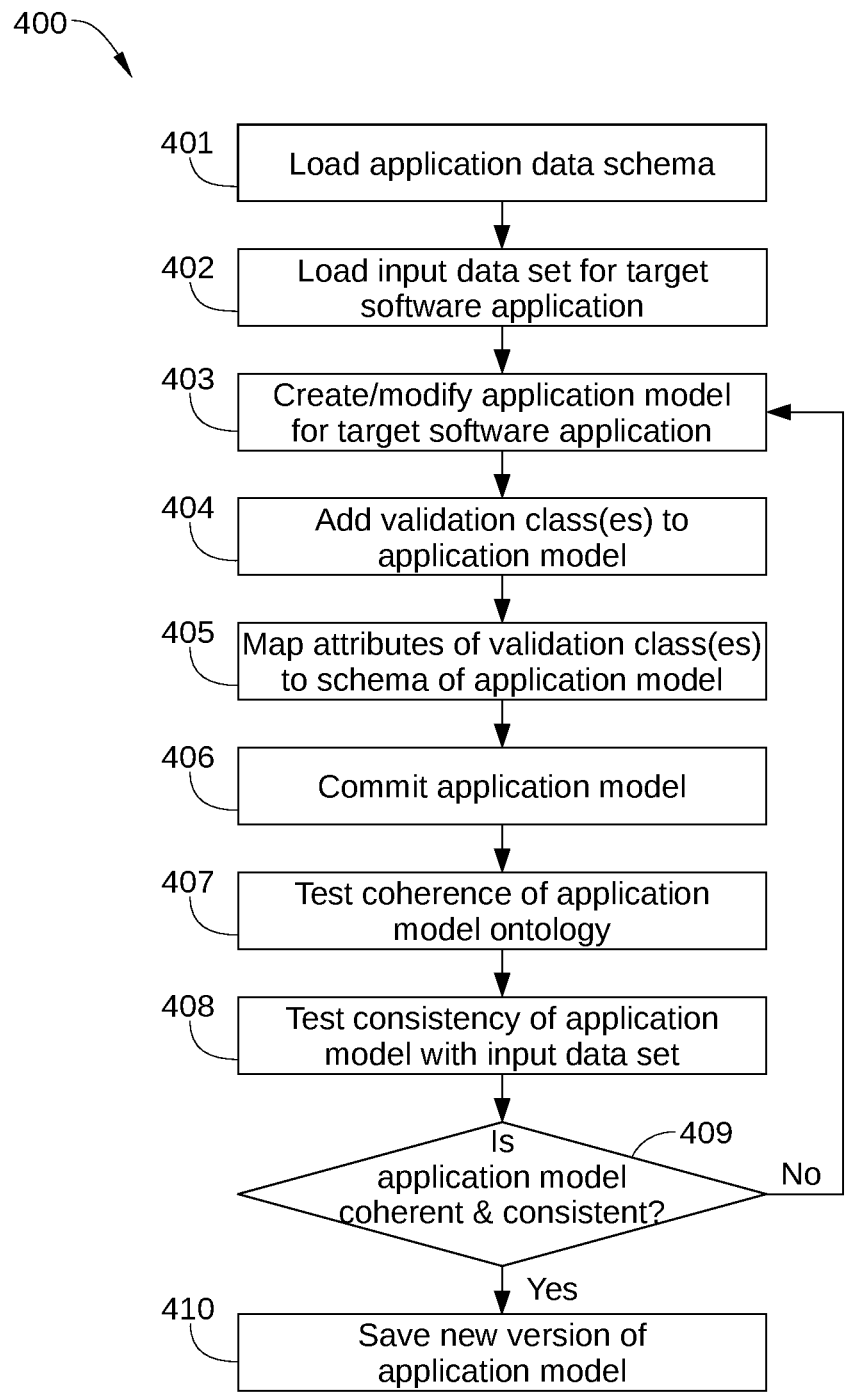

FIG. 4 sets forth a flowchart of method steps for generating a knowledge structure to validate data for a particular software application, according to various embodiments of the present invention.

Figure 5:
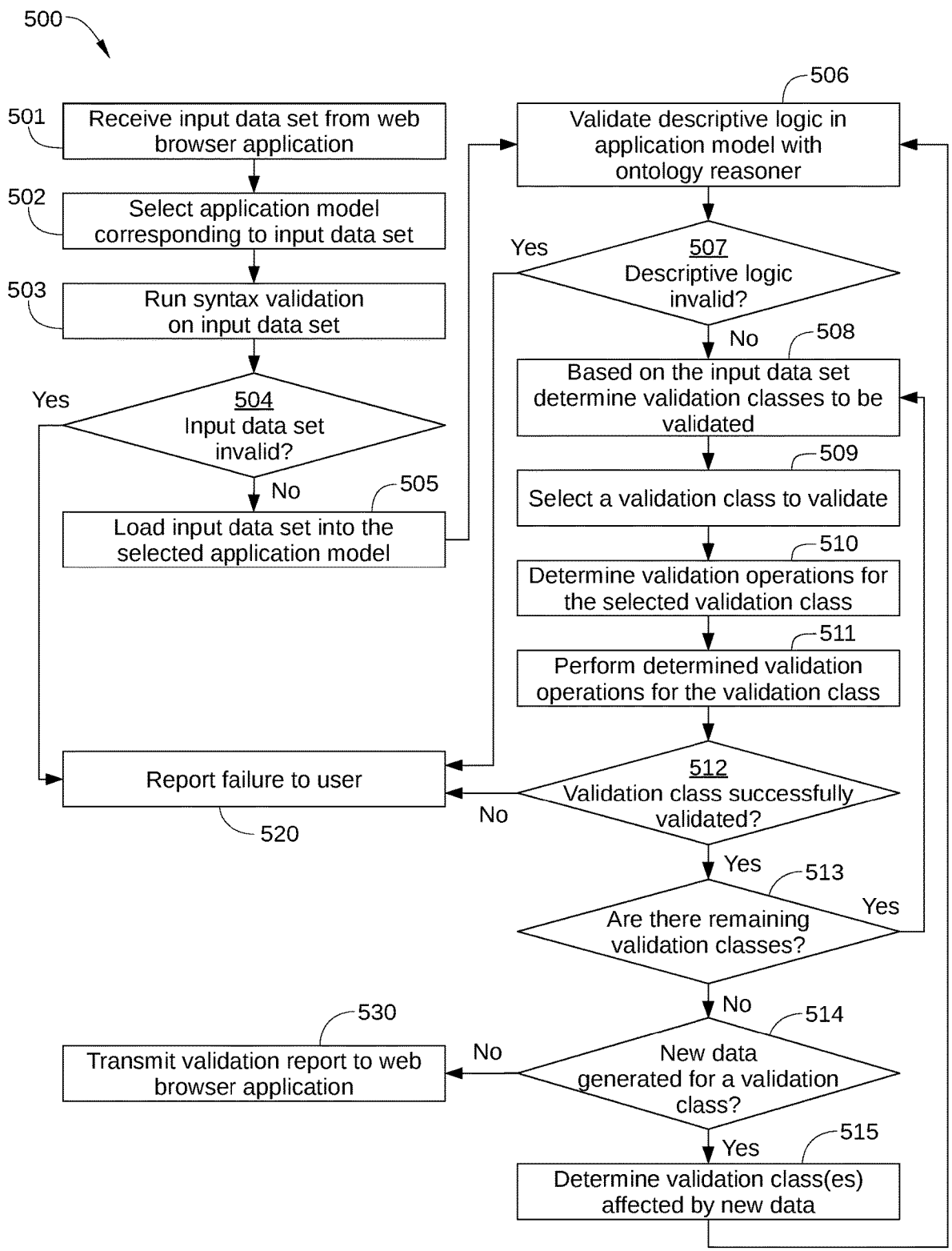

FIG. 5 sets forth a flowchart of method steps for validating data for a software application, according to various embodiments of the present invention.

Figure 6:
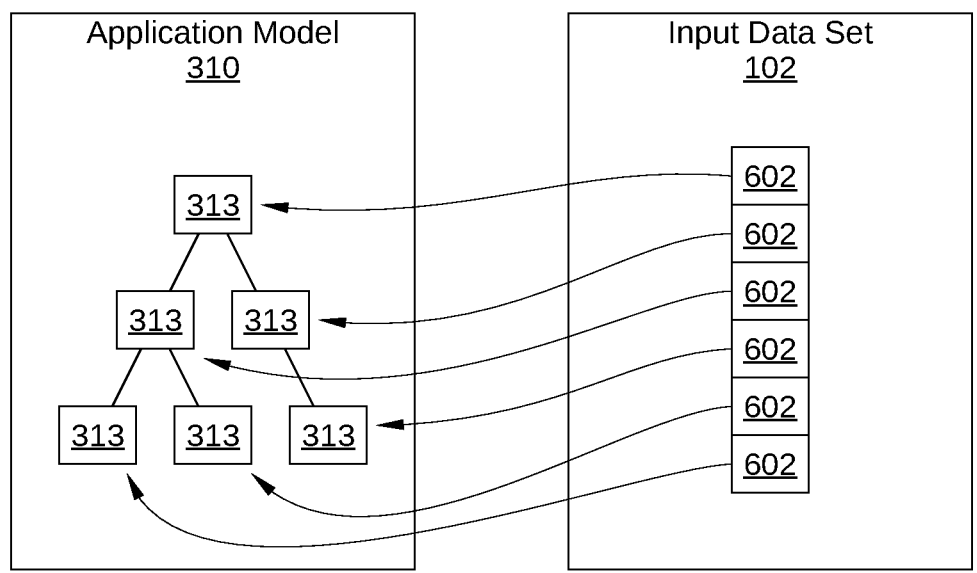

FIG. 6 schematically illustrates loading input data set into a selected application model, according to an embodiment of the present invention.

Figure 7:
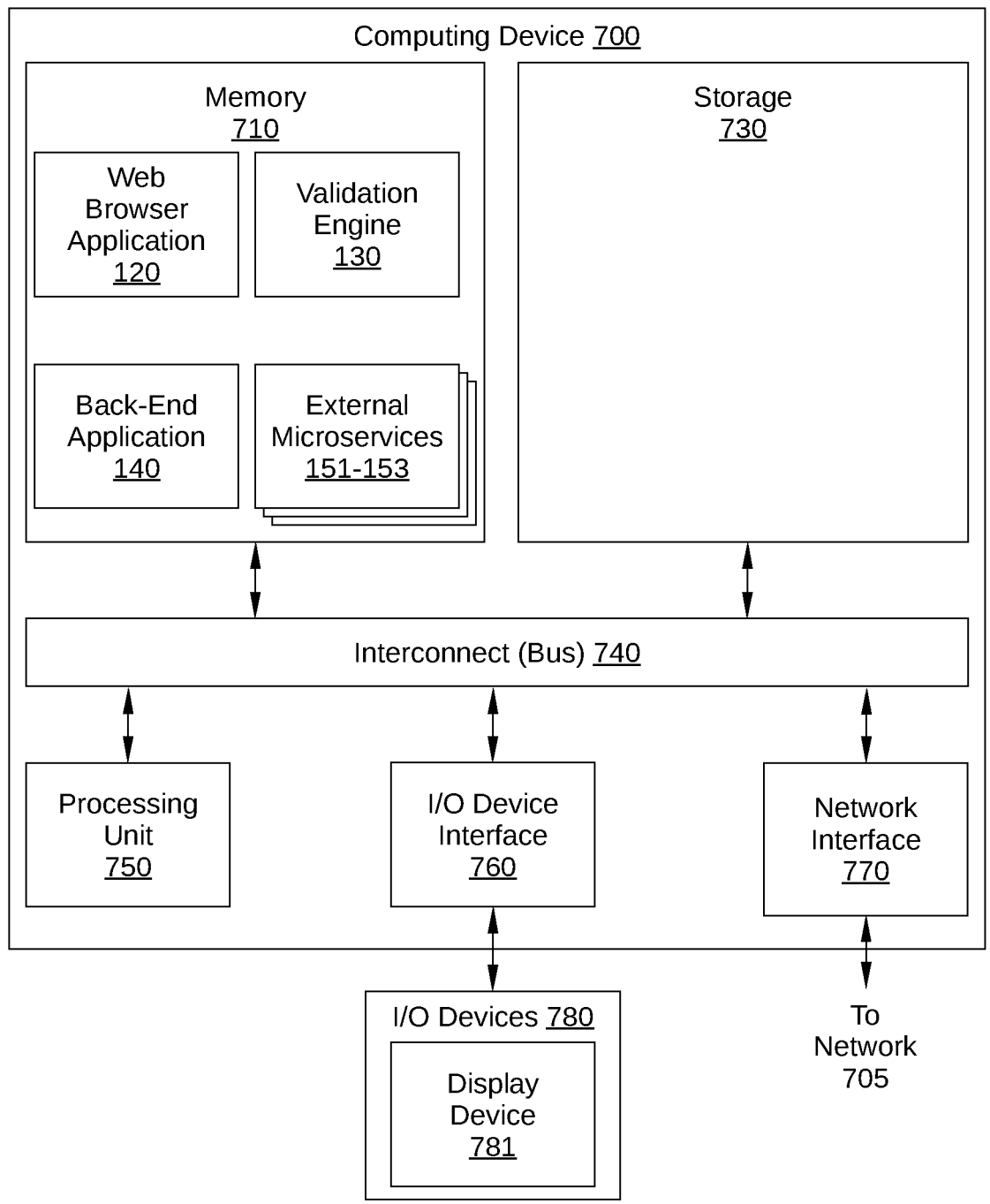

FIG. 7 is a block diagram of a computing device configured to implement one or more aspects of the present invention.

DETAILED DESCRIPTION

In the following description, numerous specific details are set forth to provide a more thorough understanding of the embodiments of the present invention. However, it will be apparent to one of skill in the art that the embodiments of the present invention may be practiced without one or more of these specific details.

System Overview

Figure 1:
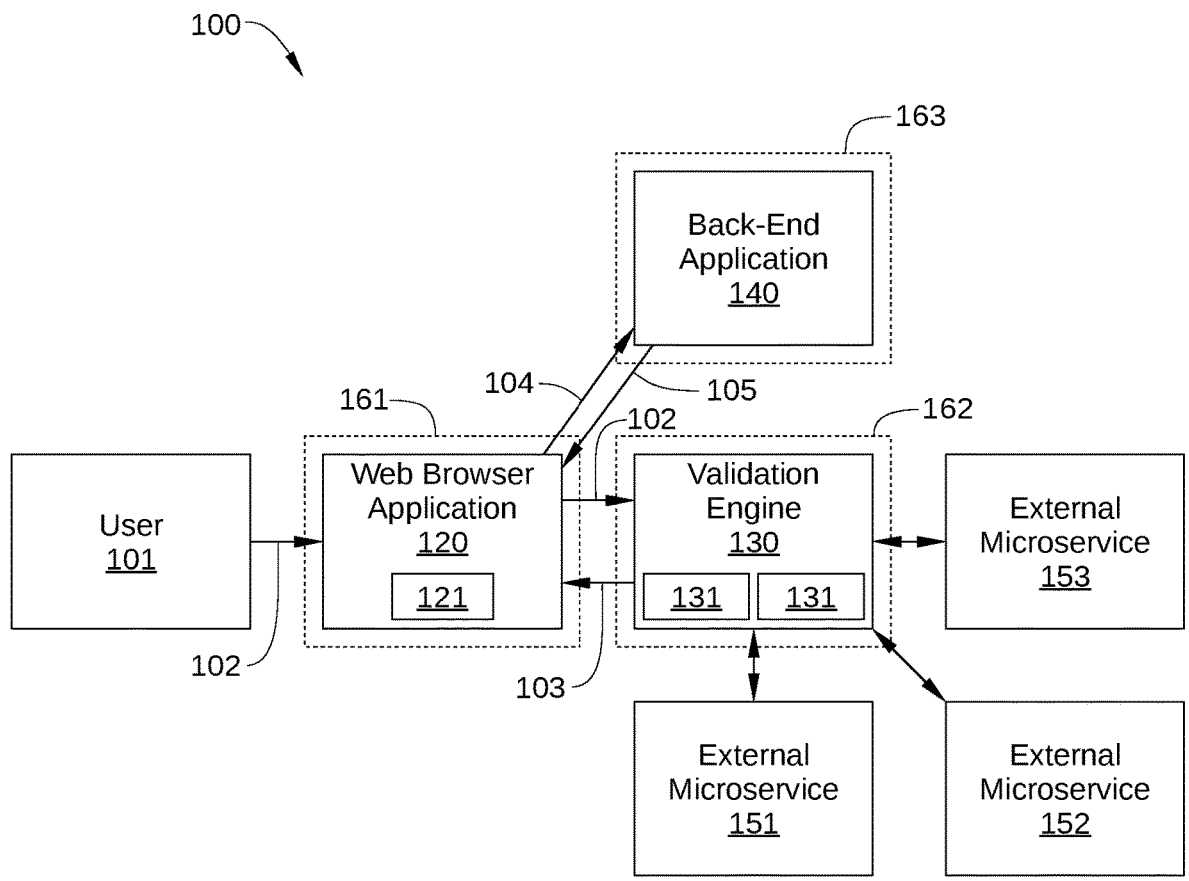
FIG. 1 illustrates a data verification system configured to implement one or more aspects of the present invention.

FIG. 1 illustrates a data verification system 100 configured to implement one or more aspects of the present invention. Data verification system 100 is configured to validate input data set 102 and generate sufficient information to guide a user 101 to find and correct invalid entries and/or other inconsistencies included in input data set 102 before back-end application 140 processes input data set 102. Data verification system 100 includes a web browser application 120 that is communicatively coupled to a validation engine 130 and to a back-end application 140. Validation engine 130 is in turn communicatively coupled to one or more individual microservices 151-153 or to infrastructure managing coordinated executions over multiple interconnected microservices 151-153. Additionally or alternatively, validation engine 130 may run the validations directly inside an internal own computing instance, such as internal processor 131. For example, in some embodiments, validation engine 130 runs one or more validations on internal processor 131 for validations with a low level of complexity.

Input data set 102 generally includes a plurality of data entries for enabling execution of back-end application 140. Further, in some embodiments, input data set 102 can include data entries of different value types, such as integer values, floating point values, text values, time and/or date values, arrays of node positions, material property values, values for boundary conditions and/or other constraints for a two- or three-dimensional geometry, values for initial conditions within a two- or three-dimensional geometry, and the like. In some embodiments, input data set 102 is configured with a payload formatted in a suitable data transfer format structured by schema to validate the content syntax, such as JavaScript object notation (JSON), extensible markup language (XML), or the like. In such embodiments, a validation report 103 generated by validation engine 130 includes a similarly formatted payload.

The web browser application 120 can also be a lightweight desktop application that enables user 101 to provide input data set 102 to validation engine 130 and/or also communicate with the back-end application 140 via its user interface (UI) 121. Thus, in some embodiments, web browser application 120 is executed on a first computing device 161, such as a computing device employed by user 101, while validation engine 130 is executed on a second computing device 162 that is separate from first computing device 161. Further, in such embodiments, back-end application 140 can be executed on a third computing device 163. Thus, in such embodiments, web browser application 120 enables user 101 to employ remote resources executed on remote computing devices.

In operation, web browser application 120 transmits executable input 104 to back-end application 140 and receives solution data 105. In instances in which no errors are determined by validation engine 130, executable input 104 is equivalent to input data set 102. In instances in which validation engine 130 returns a validation report 103 that indicates one or more errors in input data set 102, executable input 104 is based on input data set 102 and on changes made to input data set 102 based on validation report 103.

Back-end application 140 can be a simulation platform, such as a generative solver application, or any other back-end solver application that performs computationally intensive operations. For example, in some embodiments, back-end application 140 performs three-dimensional analysis and/or design, such as a computer-assisted design application. In some embodiments, back-end application 140 is executed on computing device 163 as a single software application. Alternatively, in some embodiments, back-end application 140 is executed in a distributed computing environment, such as a cloud-computing environment. In such embodiments, computing device 163 represents a plurality of distributed computing resources.

Validation engine 130 is a service or other software application configured to receive input data set 102 from web browser application 120 and validate input data set 102. Specifically, validation engine 130 performs data validation on input data set 102 before input data set 102 is processed by back-end application 140. As a result, back-end application 140 is prevented from expending computational resources to process an invalid input data set, generate a meaningless result, or potentially lead to complete execution failure. In some embodiments, validation engine 130 is further configured to generate a validation report 103 when at least a portion of input data set 102 is determined to be invalid. In such embodiments, validation report 103 includes one or more of an error message indicating that input data set 102 includes an error, a description of specific errors detected and, if generated during the validation process, recommendations for user 101 to correct the detected errors.

As performed by data validation engine 130, data validation is a decision-making process starting from a given data set composed of values (e.g., input data set 102) and ending with either a successful or failed outcome. The decision is determined by passing the data set through a set of rules controlling the validity of each entry in the data set. If the entries in the data set satisfy the rules, i.e., the pertinent validation rules are not violated, the data is considered valid. A failure of the validation rule indicates that a targeted validation level was not attained by the data set of interest.

In some embodiments, as part of validating input data set 102, validation engine 130 determines whether entries included in input data set 102 are consistent with other sets of input data to be executed by back-end application 140, consistent with other entries in input data set 102, and/or are otherwise fit for the intended use of the entry by back-end application 140. In such embodiments, validation engine 130 may employ the schema describing the data for a specific application model 310. Additionally or alternatively, in some embodiments, validation engine 130 determines whether a particular input data set 102 has sufficient data quality for execution by back-end application 140, where data quality can have various dimensions. For example, in one such embodiment, validation engine 130 determines whether a particular entry included in input data set 102 has a correct value type, such as an integral value, a floating point value, a value that falls within prescribed thresholds, a text entry of suitable length, etc. For instance, when the particular entry is a numerical value but a text entry is expected for proper execution by back-end applicable 140, validation engine 130 determines that input data set 102 is at least partially invalid. In another instance, a floating point numerical value is expected for a particular entry in input data set 102 for proper execution by back-end application 140, where the floating point numerical value must be less than a predetermined maximum threshold value and more than a predetermined minimum threshold value. Thus, when validation engine 130 determines the particular entry in input data set 102 fails to meet these criteria, validation engine 130 determines that input data set 102 is at least partially invalid.

In some embodiments, validation engine 130 determines whether a particular entry or plurality of entries in input data set 102 satisfies more complex criteria. In one such embodiment, validation engine 130 performs one or more preprocessing operations to enable validation of input data set 102. In one such embodiment, validation engine 130 performs a geometrical analysis of specific data entries included in input data set 102 (such as node locations of a computational mesh) and determines whether the specific data entries have valid values based on the geometrical analysis. For example, in an embodiment, validation engine 130 considers a structure represented by the specific data entries to be invalid when such geometrical analysis indicates the structure is not water-tight. In another embodiment, validation engine 130 considers the structure represented by the specific data entries to be invalid when such geometrical analysis indicates the center of gravity of the structure is positioned outside a specified region and/or results in a moment that exceeds a threshold value. In another embodiment, validation engine 130 considers the structure represented by the specific data entries to be invalid when such geometrical analysis indicates a portion of the structure overlaps or otherwise collides with some other structure. In another embodiment, validation engine 130 considers a specific entry in input data set 102 to be invalid when such geometrical analysis indicates a node represented by the specific data entry does not sufficiently describe the relationship of the node with adjacent nodes, such as when the node is not connected to other nodes.

In some embodiments, the preprocessing operations (e.g., the above-described geometrical analysis) are performed locally by one or more internal processors 131. In other embodiments, validation engine 130 causes one or more of the preprocessing operations to be performed remotely by microservices or by leveraging infrastructure managing the coordinated execution of multiple interconnected microservices 151-153. In either case, validation engine 130 analyzes input data set 102, determines what validation classes are associated with input data set 102, performs appropriate preprocessing operations (or causes appropriate preprocessing operations to be performed), and validates or invalidates input data set 102 based on 1) the output of the preprocessing operations and 2) on one or more validation rules applicable to the application domains associated with input data set 102.

Validation rules employed by validation engine 130 can be based on descriptive logic and/or code logic. Descriptive logic is a feature of ontology modeling. Descriptive logic rules are embedded as axioms between validation classes of a particular application model (described below in conjunction with FIG. 3) that define one or more relationships between the validation classes of the application model. Thus, descriptive logic rules implemented in embodiments of the invention complement an ontology tree of validation classes and relationships when determining the coherence and consistence of the ontology by a reasoner. Examples of such a reasoner are described below in conjunction with FIG. 3. By contrast, code logic rules are generally written in a procedural language that provides the necessary functions to transform the content of class attributes for validation. An implementation of the validation rules employed by validation engine 130 is illustrated in FIGS. 2 and 3.

Figure 2:
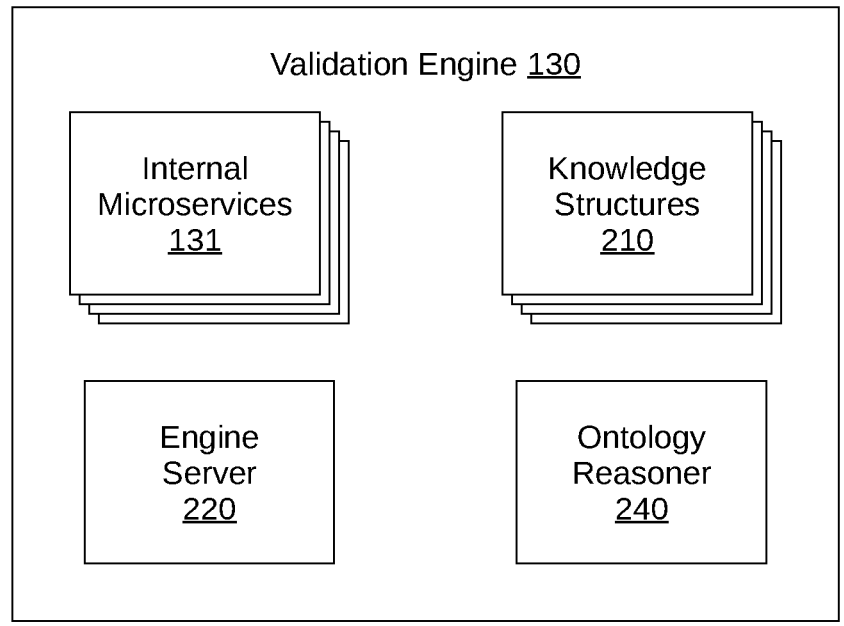
FIG. 2 is a more detailed illustration of the validation engine of FIG. 1, according to various embodiments of the present invention.

FIG. 2 is a more detailed illustration of validation engine 130 included in data verification system 100, according to various embodiments of the present invention. In the embodiment illustrated in FIG. 2, validation engine 130 includes one or more processors 131, a plurality of knowledge structures 210, and an engine server 220.

Each of knowledge structures 210 is configured to validate input data sets 102 for a particular back-end application 140. Therefore, each of knowledge structures 210 is a different application-specific element of validation engine 130. In operation, validation engine 130 determines what particular back-end application 140 is associated with a specific input data set 102 received from web browser application 102, selects the knowledge structure 210 that corresponds to that particular back-end application 140, and validates the input data set 102 using the selected knowledge structure 210. One embodiment of a knowledge structure 210 is described below in conjunction with FIG. 3.

Figure 3:
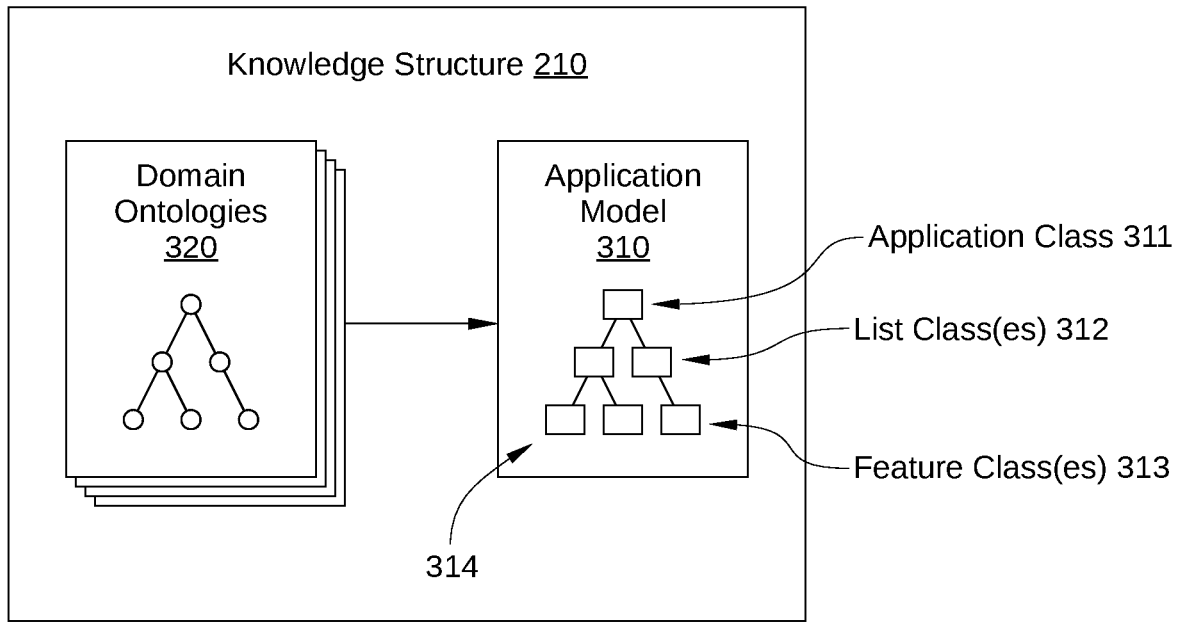
FIG. 3 is a more detailed illustration of the knowledge structure of FIG. 2, according to various embodiments of the present invention.

FIG. 3 is a more detailed illustration of a knowledge structure 210 included in validation engine 130, according to various embodiments of the present invention. In the embodiment illustrated in FIG. 3, knowledge structure 210 includes a specific application model 310 and one or more domain ontologies 320. For each specific software application, such as a particular back-end application 140, there is generally a single knowledge structure associated therewith.

Application model 310 includes the specific validation material or validation classes belonging to the domain ontologies (e.g., validation rules) for content consumed by the back-end application 140 that corresponds to the knowledge structure 210. The application model is stored inside an ontology, i.e., a tree of classes, and holds the necessary validation classes of the domain ontologies to cover the validation of the application input data set.

Application model 310 is composed of application features and domain features. Each application model 310 has one application class that serves as a root to application model 310. Then, the data structure, or specifically the presence of an array in the input data set 102, is represented by list classes 312 and connected to the root application class 311. Finally, the validation classes 313 are connected either to the application class 311 or the list class 312 depending on the location of the required data inside the expected input set data 102. Some embodiments include an application class 311, with or without list classes 312, but with one or more validation classes 313. Each instance of application model 310 comes with at least one application class 311 and one validation class 312. The combination of application class 311 with the list classes 312 and validation classes 313 creates a map of the expected input data set 102.

During the setup of knowledge structure 210, a subject-matter expert adds validation classes 313 to the application map by matching application feature attributes to disjoint or nested sets of data from the schema describing the content consumed by the back-end application 140 that corresponds to the knowledge structure 210. For example, in an instance in which back-end application 140 includes a three-dimensional solver application, such content typically includes the locations of the nodes of a plurality of mesh elements (such as tetrahedrons, hexahedrons, and/or cubes) that form a three-dimensional structure to be analyzed. During the validation of input data set 102, this matching between schema describing the content consumed by the back-end application 140 and application feature attributes is used to inject data from input data set 102 into instances of validation classes 313.

Beside validation classes 313, in some embodiments application model 310 includes two additional types of entities: application class 311 and, in the presence of an array in the input data set 102, one or more list classes 312. Application class 311 indicates the corresponding back-end application 140 for which application model 310 performs data validation. List classes 312 mark arrays included in input data set 102 that impact the matching between value entries included in input data set 102 and application feature attributes.

In some embodiments, for the same validation class 313, when an application feature attribute is matched to a value inside an array, the remaining application feature attributes can only be matched to a value inside the same array or a value placed underneath that array in the schema tree 314 of application model 310. In such embodiments, application model 310 is configured as a map of validation classes 313 that are mapped to expected data. Thus, when an application feature attribute is matched to a value contained inside an array of application model 310, there is a list class 312 for each array composing a branch between the selected value and the root of the schema describing the content consumed by the back-end application 140.

While the above-described validation rules included in application model 310 can each validate a specific validation class 313, in some embodiments, application model 310 further includes one or more dependency rules. Dependency rules are employed to build a predetermined flow of validations that are performed by application model 310. Similar to validation rules, dependency rules can include descriptive logic and/or code logic. For such dependency rules, descriptive logic connects classes using an "is dependent on" relationship, so that one validation class 313 only triggers validation if the validation class 313 that the original class depends on was already validated. In addition, for such dependency rules, a simple form of code logic can trigger the activation of class validation if a specific content is detected inside input data set 102. Validation classes 313 may during validation generate additional content, such as data values, that may be added to the original input data set 102. In some embodiments, connecting an application feature attribute to this generated content automatically creates a dependency rule between the consuming feature class and the generating feature class.

Each of domain ontologies 320 holding the core validation classes is associated logically to a particular application domain. An application domain is a field of study with which a set of common requirements, terminology, and/or functionality are associated, and a software application that performs analysis or solves problems in the application domain generally employs such requirements, terminology, and functionality. Different instances of application domains include fluid-flow analysis, structural analysis, thermal analysis, and the like. Consequently, each domain ontology 320 can include a plurality of domain features that are each mapped to specific content included in input data set 102. For example, in an instance in which a domain ontology 320 is associated with the application domain of structural analysis and back-end application 140 includes a structural simulation solver, input data set 102 generally includes a sufficiently defined geometry in the form of a mesh. Specifically, the mesh of such a geometry is composed of nodes and elements that are quantitatively described by corresponding data entries included in input data set 102. In such an instance, geometry is the domain, while the mesh, nodes, and elements of the geometry are the domain features. Thus, each element is identified as a group of values or domain features in the content consumed by back-end application 140 (e.g., the structural simulation solver). For example, the axial coordinates of nodes are attributes of each node. In some embodiments, each domain feature uses or is associated with a set of validation rules to verify the consistence of such attributes. For example, in an instance in which a node of a geometry is a domain feature, a simple validation rule for the node can include checking whether a coordinate value for the node is above a certain value.

In some embodiments, domain features can be connected within the same domain-space to direct the flow of domain feature validations. Such interdependencies between domain features are represented in the ontology as relationships between validation classes. The interdependencies are implemented via descriptive logic. Such descriptive logic can be validated using ontology reasoner 240, which can be a readily available industry reasoner, to infer logical coherence and content consistency from a set of asserted descriptive logic facts and axioms. Some reasoners use variants of the tableaux reasoning algorithm to compute the deductive closure of a set of facts and rules, such as the Pellet reasoner, which is an open-source Java based Web Ontology Language (OWL) reasoner. An alternative reasoner for ontologies written using OWL is HermiT. In such embodiments, knowledge structure 210 can include two layers of descriptive logic: a first layer at the domain-level (and included in one or more of domain ontologies 320) and a second layer at the application-level (and included in application model 310). Each domain ontology is described by its own unique namespace. In such embodiments, when descriptive logic is bound to the domain namespace of a validation class 313, an associated rule is then embedded within the associated domain ontology 320. Conversely, when descriptive logic connects multiple namespaces, an associated rule is embedded instead within application model 310.

As shown in FIG. 3, generation of one or more list classes 312, and one or more validation classes 313 is based on multiple domain ontologies 320. In some embodiments, certain domain ontologies 320 included in a particular knowledge structure 210 can also be included in a different knowledge structure 210 (not shown) that is associated with a different back-end application 140. For example, in an instance in which back-end application 140 includes a three-dimensional structural solver application, validation of a three-dimensional geometry is one element in validating input data set 102. Consequently, one domain ontology 320 employed to generate validation rules for application model 310 is an ontology with classes describing a three-dimensional geometry. Because validation of a three-dimensional geometry is also an element in validating input data set 102 for a back-end application 140 that includes a three-dimensional fluid-flow solver application, the three-dimensional geometry ontology included in the knowledge structure 210 for the three-dimensional structural solver application can also be included in the knowledge structure 210 for the three-dimensional fluid-flow solver application. Thus, such embodiments facilitate an approach whereby the necessary knowledge/domain ontologies to validate data for complex applications can be employed in a modular form that can be reused and recomposed for different applications.

Returning to FIG. 2, engine server 220 is configured to automatically generate, or facilitate generation of, knowledge structures 210. Thus, for each new application, given a particular format of input data set 102, such as a JSON, HTML, or XML schema, validation engine 130 automatically creates an application class 310 for the validation rules covering the entire source of data. Further, in some embodiments, during setup of a particular knowledge structure 210, a subject-matter expert adds domain features to the map of an application model by matching application feature attributes to data from the schema that describes the content consumed by the back-end application 140 for that particular knowledge structure 210. One such embodiment is illustrated in FIG. 4.

Data Validation

FIG. 4 sets forth a flowchart of method steps for generating a knowledge structure 210 to validate data for a particular software application, according to various embodiments of the present invention. Although the method steps are described in conjunction with the systems of FIGS. 1-3, persons skilled in the art will understand that any system configured to perform the method steps, in any order, is within the scope of the present invention.

As shown, a method 400 begins at step 401, where engine server 220 or another element of validation engine 130 loads application data schema for a target software application, such as back-end application 140.

In step 402, engine server 220 or another element of validation engine 130 loads a specific input data set for the target software application. The specific input data set is selected to have a known validation outcome when imported into the current version of application model 310 that has not yet been modified in method 400. In step 403, the schema describing the application input data is then imported or otherwise loaded and an application model 310 is created for the target software application. In step 404, a subject-matter expert adds one or more validation classes 313 to the application model 310. In step 405, the subject-matter expert associates or otherwise maps the attributes of each validation class 313 to the schema. In step 406, after the content of the application model 310 is complete, the subject-matter expert commits the content as a new version of the application model 310.

In step 407, engine server 220 or another element of validation engine 130, such as ontology reasoner 240, tests the coherence of the ontology of the revised application model 310. Generally, the input data set is not considered in step 407.

In step 408, engine server 220 or another element of validation engine 130 uses the specific input data set loaded in step 402 to confirm that the new version of the application model functions consistently. Specifically, the input data set loaded in step 402 is employed as a test case with a known outcome. Therefore, changes to the validation classes 313 of the application model are tested with such a test case to confirm that the added validation content of the new version of the application model 310, e.g., new validation rules, still function properly and the changes made to the existing version of the application model 310 have not been compromised. In some embodiments, multiple input data sets can be loaded in step 402 and employed to test the current version of the application model 310. In such embodiments, the known outcome for one input data set can be a failure of one or more validation rules. Thus, when such a failure does not occur in step 406, the existing validation rules can be assumed to be compromised.

In step 409, engine server 220 or another element of validation engine 130 determines whether the new version of the application model 310 is coherent and consistent. The determination of step 409 is based on the outcome of steps 407 and 408. If yes, method 400 proceeds to step 410, the new version of the application model 310 is saved, and method 400 terminates; if no, method 400 returns back to step 403, where the subject-matter expert modifies the new version of application model 310. In some embodiments, the necessary information is provided to the subject matter expert to identify which validation material did not match the given input data.

Data Validation

FIG. 5 sets forth a flowchart of method steps for validating data for a software application, according to various embodiments of the present invention. Although the method steps are described in conjunction with the systems of FIGS. 1-4, persons skilled in the art will understand that any system configured to perform the method steps, in any order, is within the scope of the present invention.

As shown, a method 500 begins at step 501, where validation engine 130 receives input data set 102 from web browser application 120.

In step 502, validation engine 130 selects an application model 310 that corresponds to the input data set 102 received in step 501. In some embodiments, validation engine 130 selects the application model 310 based on what back-end application 140 is associated with the input data set 102.

In step 503, validation engine 130 runs syntax validation on input data set 102.

In step 504, based on the syntax validation performed in step 503, validation engine 130 determines whether the input data set 102 is invalid. If yes, method 500 proceeds to step 520; if no, method 500 proceeds to step 505.

In step 505, validation engine 130 loads input data set 102 into the selected application model 310. FIG. 6 illustrates an embodiment of loading of input data set 102 into a selected application model 310.

FIG. 6 schematically illustrates loading input data set 102 into a selected application model 310, according to an embodiment of the present invention. As shown, input data set 102 includes a plurality of entries 602. Each different entry 602 corresponds to a different validation class 313 included in application model 310 and acts as an instance of that particular validation class 313. Thus, when input data set 102 is loaded into application model 310, a different entry 602 is loaded into a different validation class 313 for validation by validation engine 130.

In the embodiment illustrated in FIG. 6, an entry 602 from a single contiguous portion of input data set 102 is loaded into a particular validation class 313. In other embodiments, data entries 602 from multiple discontinuous portions of input data set 102 may be associated with a single validation class 313.

Returning to FIG. 5, in step 506, validation engine 130 checks validity of the descriptive logic included in the application model with ontology reasoner 240. In step 505, validation engine 130 determines whether the descriptive logic of the selected application model 301 is valid when loaded with the input data set. If yes, method 500 proceeds to step 520; if no, method 500 continues to step 508.

In step 508, validation engine 130 determines the validation classes 313 to be validated in application model 310. The determination is made based on the content of input data set 102. For example, in an embodiment in which back-end application 140 includes a three-dimensional fluid-flow solver, one portion of data entries in input data set 102 corresponds to the domain features associated with elements of a three-dimensional geometry, such as the nodes of the three-dimensional geometry. Thus, in the embodiment, one validation class 313 that is to be validated is the validation class 313 that is associated with the portion of data entries in input data set 102 that corresponds to the domain features associated with elements of a three-dimensional geometry. In the embodiment, another portion of the data entries in input data set 102 corresponds to the domain features associated with fluid flow analysis, such as boundary conditions, initial conditions, material properties, and the like. Thus, in the embodiment, one validation class 313 that is to be validated is the validation class 313 that is associated with the portion of data entries in input data set 102 that corresponds to domain features associated with fluid flow analysis.

In step 509, validation engine 130 selects a particular validation class 313 to validate from the validation classes 313 determined in step 508. For example, based on the format, content, and or metadata included in input data set 102, validation engine 130 can select one validation class 313 for input data set 102 that is associated with one of fluid-flow analysis, structural analysis, thermal analysis, geometric analysis, etc.

In step 510, validation engine 130 determines validation operations for the selected validation class 313 based on the validation class 313 determined in step 509. For example, in some embodiments, validation engine 130 selects the validation operations for a domain feature or a group of domain features. In such embodiments, the selected validation operations may be associated with a specific list class 312 and/or one or more validation classes 313 of application model 310.

In step 511, validation engine 130 causes the validation operations selected in step 406 to be performed. That is, data entries included in the selected portion of input data set 102 are tested for validity using the validation operations selected in step 510. In some embodiments, validation engine 130 performs one or more of the validation operations locally, for example via one or more internal processors 131. Alternatively or additionally, in some embodiments, validation engine 130 causes one or more of the validation operations to be implemented via one or more external microservices 151-153.

In step 512, validation engine 130 determines whether the validation operations of step 511 are successful. For example, in some embodiments, such a determination is based on whether all validation rules are not violated by any of the data entries employed as an instance of the validation class 313 being validated. If validation engine 130 determines the validation operations are successful, method 500 proceeds to step 513; if validation engine 130 determines the validation operations are not successful, method 500 proceeds to step 520.

In step 513, validation engine 130 determines whether there are any remaining validation classes to be validated. If yes, method 500 returns back to step 506; if no, method 500 proceeds to step 514. In the embodiment illustrated in FIG. 5, validation classes 313 are validated sequentially. In other embodiments, step 509-512 can be performed for multiple validation classes in parallel. For example, in such embodiments, for each validation class 313, a different external microservice 151 may be employed to perform step 509-512 to validate that validation class 313.

In step 514, validation engine 130 determines whether any new data are generated for a validation class 313 that has not yet been determined to be a validation class 313 to be validated. If yes, method 500 continues to step 514; if no, method 500 continues to step 530 and terminates.

In step 515, validation engine 130 determines what validation class or classes 313 are affected by the new data determined in step 514. For example, when a first validation class 313 includes the nodes of a mesh, the nodes of the mesh are validated in a first validation operation. A subsequent second validation operation can be performed on a second validation class 313, in which a center of gravity of the mesh is calculated based on the validated mesh. A third validation operation can then be performed on a third validation class 313, in which a moment of a force applied to a structure is calculated based on the center of gravity of the mesh. A fourth validation operation can then be performed on a fourth validation class 313, in which boundary consistency over the boundary conditions is validated based on the center of gravity of the mesh and on the moment. Method 500 then returns back to step 508, where validation classes 313 are determined that need to be validated.

In step 520, validation engine 130 reports validation failures accordingly. For example, in some embodiments, validation engine 130 transmits a validation report or other notification that validation was unsuccessful. Generally, the validation report includes sufficient information to inform the subject-matter expert what prevented successful validation.

In step 530, validation engine 130 transmits the validation report 103, when applicable, to web browser application 120. In some embodiments, in addition to specific errors detected in input data set 102 by validation engine 130, validation report 103 includes recommendations for correcting the detected errors indicated in validation report 103.

FIG. 7 is a block diagram of a computing device 700 configured to implement one or more aspects of the present invention. Thus, computing device 700 can be configured as one or more of first computing device 161, second computing device 162 or third computing device 163 of FIG. 1. Computing device 700 may be a desktop computer, a laptop computer, a tablet computer, or any other type of computing device configured to receive input, process data, generate control signals, and display images. Computing device 700 is configured to run web browser application 120, validation engine 130, back-end application 140, external microservices 151-153, and/or other suitable software applications, which reside in a memory 710. It is noted that the computing device described herein is illustrative and that any other technically feasible configurations fall within the scope of the present invention.

As shown, computing device 700 includes, without limitation, an interconnect (bus) 740 that connects a processing unit 750, an input/output (I/O) device interface 760 coupled to input/output (I/O) devices 780, memory 710, a storage 730, and a network interface 770. Processing unit 750 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit 750 may be any technically feasible hardware unit capable of processing data and/or executing software applications, including web browser application 120, validation engine 130, back-end application 140, and/or external microservices 151-153. Further, in the context of this disclosure, the computing elements shown in computing device 700 may correspond to a physical computing system (e.g., a system in a data center) or may be a virtual computing instance executing within a computing cloud.

I/O devices 780 may include devices capable of providing input, such as a keyboard, a mouse, a touch-sensitive screen, and so forth, as well as devices capable of providing output, such as a display device 781. Additionally, I/O devices 780 may include devices capable of both receiving input and providing output, such as a touchscreen, a universal serial bus (USB) port, and so forth. I/O devices 780 may be configured to receive various types of input from an end-user of computing device 700, and to also provide various types of output to the end-user of computing device 700, such as one or more graphical user interfaces (GUI), displayed digital images, and/or digital videos. In some embodiments, one or more of I/O devices 780 are configured to couple computing device 700 to a network 705.

Network 705 may be any technically feasible type of communications network that allows data to be exchanged between computing device 700 and external entities or devices, such as a smart device, a wearable smart device, a web server, or another networked computing device (not shown). For example, network 705 may include a wide area network (WAN), a local area network (LAN), a wireless (WiFi) network, a Bluetooth network and/or the Internet, among others.

Memory 710 may include a random access memory (RAM) module, a flash memory unit, or any other type of memory unit or combination thereof. Processing unit 750, I/O device interface 760, and network interface 770 are configured to read data from and write data to memory 710. Memory 710 includes various software programs that can be executed by processor 750 and application data associated with said software programs, including web browser application 120, validation engine 130, back-end application 140, and/or external microservices 151-153.

In sum, embodiments of the present invention provide techniques for validating data for the efficient execution of computationally intensive operations and analysis in a distributed architecture or Cloud environment. A validation engine performs validation operations on input data for a back-end application, thereby separating the step of validation historically embedded inside desktop applications and also unloading the burden of validation checks from a front-end interface, such as a web browser application configured to access the back-end application. A knowledge structure and application model that include validation rules are generated based on domain-specific ontologies. The domain-specific ontologies are modular and can be applied to generating knowledge structures and application models for other back-end applications.

At least one technical advantage of the disclosed techniques is that a complex validation process can be performed on input data prior to the input data being used in large-scale simulation or other computationally intensive operations. As a result, computational resources are not expended to generate a solution based on invalid data. Another technical advantage of the disclosed techniques is that each data subset of input data for a computationally intensive operation, such as a data subset associated with a particular application domain, can undergo a separate validation process. Consequently, validation errors can be tracked and corrected more easily, i.e., by domain feature classes. Further, each separate validation process can be executed on cloud-based computing assets, leveraging the expansive storage and computing power of distributed computing platforms. By facilitating validation of input data, even when the input data is associated with various domain feature classes. Thus, the advantages provide at least one technological improvement over prior art techniques, which frequently result in the expenditure of computational resources to process invalid data and generate difficult-to-troubleshoot validation errors.

1. In some embodiments, a computer-implemented method for validating a set of input data used by a software application includes: determining a first validation class for a first portion of the set of input data; determining a first validation operation to be performed on the first portion of the set of input data based on the first validation class; causing the first validation operation to be performed on the first portion of the set of input data; determining that the first validation operation is unsuccessful; and generating a validation report indicating that the set of input data includes an error.

2. The computer-implemented method of clause 1, further comprising: determining a second validation class for a second portion of the set of input data; determining a second validation operation to be performed on second portion of the set of input data based on the second validation class; and causing the second validation operation to be performed on the second portion of the set of input data.

3. The computer-implemented method of clauses 1 or 2, wherein determining the second validation operation comprises determining the second validation operation in response to determining the first validation class.

4. The computer-implemented method of any of clauses 1-3, wherein determining the first validation class and the second validation class comprises analyzing the set of input data with a semantic reasoner.

5. The computer-implemented method 1-4, wherein generating the validation report comprises generating the validation report based on a first outcome of the first validation operation and a second outcome of the second validation operation.

6. The computer-implemented method of any of clauses 1-5, wherein the first validation class and the second validation class are included in an application model associated with the software application.

7. The computer-implemented method of any of clauses 1-6, further comprising loading the set of input data into the application model, wherein the first portion of the set of input data comprises a first instance of the first validation class and the second portion of the set of input data comprises a second instance of the second validation class.

8. The computer-implemented method of any of clauses 1-7, wherein initiating validation of the first validation class is logically dependent on completion of validation of the first validation class.

9. The computer-implemented method of any of clauses 1-8, wherein causing the first validation operation to be performed on at least a portion of the set of input data comprises: determining a first microservice to perform the first validation operation; and causing the first microservice to perform the first validation operation on the first portion of the set of input data.

10. The computer-implemented method of any of clauses 1-9, wherein the first microservice performs the first validation operation while executed on one of a first computing device on which the determining the validation class is executed or a second computing device that is remote from the first computing device.

11. The computer-implemented method of any of clauses 1-10, wherein the first validation operation comprises a preprocessing operation that generates a value associated with the set of input data.

12. The computer-implemented method of any of clauses 1-11, further comprising causing a second validation operation to be performed on the first portion of the set of input data based on the value associated with the at first portion of the set of input data.

13. The computer-implemented method of any of clauses 1-12, wherein causing the first validation operation to be performed on the first portion of the set of input data comprises executing a plurality of validation rules specific to the first validation class.

14. The computer-implemented method of any of clauses 1-13, further comprising: determining that the first validation operation is successful; and causing the software application to generate a validation report indicating that the set of input data includes no errors.

15. The computer-implemented method of any of clauses 1-14, wherein causing first validation operation to be performed comprises causing a validation rule specific to the first validation class to be executed.

16. A non-transitory computer readable medium storing instructions that, when executed by a processor, cause the processor to perform the steps of: determining an application model for a set of input data; determining a first set of validation operations to be performed on the set of input data based on the application feature classes; causing the first validation operation to be performed on at least a portion of the set of input data; determining that the first set of validation operations is either successful or unsuccessful; and generating a validation report indicating that the set of input data includes an error.

17. The non-transitory computer readable medium of clause 16, wherein determining the first validation operation to be performed on the set of input data comprises selecting one or more validation rules from a plurality of validation rules associated with the application model.

18. The non-transitory computer readable medium of clauses 16 or 17, wherein causing the first validation operation to be performed on the at least a portion of the set of input data further comprises executing the one or more validation rules.

19. The non-transitory computer readable medium of any of clauses 16-18, wherein the first validation operation is associated with a domain feature of the application model.

20. The non-transitory computer readable medium of any of clauses 16-19, wherein causing the first validation operation to be performed on at least a portion of the set of input data comprises: determining a first process or set of microservices that should perform at least a portion of the first validation operation; and causing the first process or set of microservices to perform the at least a portion of the first set of validation operations on the at least a portion of the set of input data.

21. The non-transitory computer readable medium of any of clauses 16-20, wherein the at least a portion of the first validation operation comprises a preprocessing operation that may generate a value associated with the at least a portion of the set of input data.

22. The non-transitory computer readable medium of any of clauses 16-21, wherein causing the at least a portion of the first validation operation to be performed on the at least a portion of the set of input data further comprises executing at least one validation rule specific to the application domain based on the value associated with the at least a portion of the set of input data.

23. The non-transitory computer readable medium of any of clauses 16-22, further comprising: determining that the first validation operation is successful; and causing the software application to generate a validation report indicating that the set of input data include no errors.

24. The non-transitory computer readable medium of any of clauses 16-23, wherein causing first validation operation to be performed comprises causing a validation rule specific to the application domain to be executed.

25. In some embodiments, a system includes: a memory that stores instructions; and a processor that is coupled to the memory and is configured to perform the steps of, upon executing the instructions: determining an application model for a set of input data; determining a first set of validation operations to be performed on the set of input data based on the application model; causing the first validation operation to be performed on at least a portion of the set of input data; determining that the first validation operation is either successful or unsuccessful; and generating a validation report indicating that the set of input data includes an error.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of application data, content servers, and client devices, persons skilled in the art will appreciate that the systems and techniques described herein are applicable to other types of application data, content servers, and client devices. The foregoing description and drawings are, accordingly, to be regarded in an illustrative rather than a restrictive sense.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method for validating a set of input data used by a software application, the method comprising:
    determining an application model associated with the software application that is to receive the set of input data after the set of input data is validated;
    determining a first validation class for a first portion of the set of input data based on the application model;
    determining a first validation operation to be performed on the first portion of the set of input data based on the first validation class;
    causing the first validation operation to be performed on the first portion of the set of input data;
    determining that the first validation operation is unsuccessful; and
    generating a validation report indicating that the set of input data includes an error.

2. The computer-implemented method of claim 1, further comprising:
    determining a second validation class for a second portion of the set of input data;
    determining a second validation operation to be performed on second portion of the set of input data based on the second validation class; and
    causing the second validation operation to be performed on the second portion of the set of input data.

3. The computer-implemented method of claim 2, wherein determining the second validation operation comprises determining the second validation operation in response to determining the first validation class.

4. The computer-implemented method of claim 2, wherein determining the first validation class and the second validation class comprises analyzing the set of input data with a semantic reasoner.

5. The computer-implemented method of claim 2, wherein generating the validation report comprises generating the validation report based on a first outcome of the first validation operation and a second outcome of the second validation operation.

6. The computer-implemented method of claim 2, wherein the first validation class and the second validation class are included in the application model associated with the software application.

7. The computer-implemented method of claim 6, further comprising loading the set of input data into the application model, wherein the first portion of the set of input data comprises a first instance of the first validation class and the second portion of the set of input data comprises a second instance of the second validation class.

8. The computer-implemented method of claim 7, wherein initiating validation of the first validation class is logically dependent on completion of validation of the first validation class.

9. The computer-implemented method of claim 1, wherein causing the first validation operation to be performed on at least a portion of the set of input data comprises:
    determining a first microservice to perform the first validation operation; and causing the first microservice to perform the first validation operation on the first portion of the set of input data.

10. The computer-implemented method of claim 9, wherein the first microservice performs the first validation operation while executed on one of a first computing device on which the determining the validation class is executed or a second computing device that is remote from the first computing device.

11. The computer-implemented method of claim 9, wherein the first validation operation comprises a preprocessing operation that generates a value associated with the set of input data.

12. The computer-implemented method of claim 11, further comprising causing a second validation operation to be performed on the first portion of the set of input data based on the value associated with the at first portion of the set of input data.

13. The computer-implemented method of claim 1, wherein causing the first validation operation to be performed on the first portion of the set of input data comprises executing a plurality of validation rules specific to the first validation class.

14. The computer-implemented method of claim 1, further comprising:
   determining that the first validation operation is successful; and
   causing the software application to generate a validation report indicating that the set of input data includes no errors.

15. The computer-implemented method of claim 1, wherein causing the first validation operation to be performed comprises causing a validation rule specific to the first validation class to be executed.

16. One or more non-transitory computer-readable media storing instructions that, when executed by one or more processors, cause the one or more processors to perform the steps of:
   determining an application model associated with a software application that is to receive a set of input data after the set of input data is validated;
   determining a first validation class for at least a portion of the set of input data based on the application model;
   causing a first validation operation to be performed on the at least a portion of the set of input data;
   determining that the first validation operation is unsuccessful; and
   generating a validation report indicating that the set of input data includes an error.

17. The one or more non-transitory computer-readable media of claim 16, further comprising determining the first validation operation to be performed based on the first validation class by selecting one or more validation rules from a plurality of validation rules associated with the application model based on the first validation class.

18. The one or more non-transitory computer-readable media of claim 17, wherein causing the first validation operation to be performed on the at least a portion of the set of input data further comprises executing the one or more validation rules.

19. The one or more non-transitory computer-readable media of claim 16, wherein the first validation operation is associated with a domain feature of the application model.

20. The one or more non-transitory computer-readable media of claim 16, wherein causing the first validation operation to be performed on the at least a portion of the set of input data comprises:
   determining a first process or set of microservices that should perform at least a portion of the first validation operation; and
   causing the first process or set of microservices to perform the at least a portion of the first validation operation on the at least a portion of the set of input data.

21. The one or more non-transitory computer-readable media of claim 20, wherein the at least a portion of the first validation operation comprises a preprocessing operation that may generate a value associated with the at least a portion of the set of input data.

22. The one or more non-transitory computer-readable media of claim 21, wherein causing the at least a portion of the first validation operation to be performed on the at least a portion of the set of input data further comprises executing at least one validation rule specific to the application model based on the value associated with the at least a portion of the set of input data.

23. The one or more non-transitory computer-readable media of claim 22, further comprising:
   determining that the first validation operation is successful; and
   causing the software application to generate a validation report indicating that the set of input data include no errors.

24. The one or more non-transitory computer-readable media of claim 16, wherein causing first validation operation to be performed comprises causing a validation rule specific to the application model to be executed.

25. A system, comprising:
   a memory that stores instructions; and
   at least one processor that is coupled to the memory and, upon executing the instructions, performs the steps of:
      determining an application model associated with a software application that is to receive a set of input data after the set of input data is validated;
      determining a first validation class for at least a portion of the set of input data based on the application model;
      causing a first validation operation to be performed on the at least a portion of the set of input data;
      determining that the first validation operation is unsuccessful; and
      generating a validation report indicating that the set of input data includes an error.

* * * * *

UNITED STATES PATENT AND TRADEMARK OFFICE
CERTIFICATE OF CORRECTION

| | | |
|---|---|---|
| PATENT NO. | : 11,288,259 B2 | Page 1 of 1 |
| APPLICATION NO. | : 16/694910 | |
| DATED | : March 29, 2022 | |
| INVENTOR(S) | : Daniel Mercier and Anthony Ruto | |

It is certified that error appears in the above-identified patent and that said Letters Patent is hereby corrected as shown below:

In the Claims

Column 20, Claim 20, Line 15, please delete "the" before at.

Signed and Sealed this
Twenty-eighth Day of June, 2022

Katherine Kelly Vidal
*Director of the United States Patent and Trademark Office*